United States Patent [19]

Tsuda

[11] Patent Number: 5,533,059
[45] Date of Patent: Jul. 2, 1996

[54] CARRIER PHASE LOCK DETECTING APPARATUS USED IN PSK-MODULATED SIGNAL RECEIVER FOR SATELLITE COMMUNICATION SYSTEM

[75] Inventor: Hiroki Tsuda, Tokyo, Japan

[73] Assignee: NEC Corporation, Japan

[21] Appl. No.: 135,065

[22] Filed: Oct. 12, 1993

[30] Foreign Application Priority Data

Oct. 13, 1992 [JP] Japan ................................. 4-273934

[51] Int. Cl.⁶ .............................. H03D 3/18; H03D 3/24
[52] U.S. Cl. .......................... 375/327; 375/329; 329/307
[58] Field of Search ............................. 375/81, 119, 118, 375/120, 83; 455/260; 329/304, 306, 307; 327/156, 158, 159, 162

[56] References Cited

U.S. PATENT DOCUMENTS

| | | | |
|---|---|---|---|
| 4,121,166 | 10/1978 | Matsumoto et al. | |
| 4,259,740 | 3/1981 | Snell et al. | |
| 4,547,736 | 10/1985 | Takeda | 329/307 X |
| 4,853,642 | 8/1989 | Otasi et al. | 329/124 |
| 4,871,973 | 10/1989 | Yoshihara | 375/81 X |
| 5,147,329 | 10/1992 | Iwasaki et al. | 375/329 X |
| 5,157,694 | 10/1992 | Iwasaki et al. | 329/107 X |
| 5,241,567 | 8/1993 | Shimakata | 329/307 X |

FOREIGN PATENT DOCUMENTS 243589 2/1987 European Pat. Off. .
2826725 6/1978 Germany .

OTHER PUBLICATIONS

H. Ishio, et al., "High Speed 4–Phase PSK Modem Circuits", *Review of the Electrical Communication Laboratories*, vol. 23, Nos. 7-8, pp. 919–938, Jul.–Aug. 1975.

H. Ishio, et al., "Design and Performance of Carrier Recovery Circuit for 806 Mb/s 4–Phase PSK Transmission System", *Abstracts of the Transactions of the Institute of Electronics and Communication Engineers of Japan*, vol. 57, No. 10, pp. 22–23, Oct. 1974.

*Primary Examiner*—Stephen Chin
*Assistant Examiner*—Bryan Webster
*Attorney, Agent, or Firm*—Ostrolenk, Faber, Gerb & Soffen

[57] ABSTRACT

In a PSK-modulating arrangement including a voltage controlled oscillator (VCO), a demodulator, a phase detector and a loop filter, a carrier phase lock detecting apparatus is equipped with the arrangement, the apparatus comprising a first multiplier for inversely modulating a demodulated signal by a reference carrier signal from the VCO, a second multiplier for multiplying the output of the first multiplier by an input PSK-modulated signal and a decision circuit for detecting carrier phase lock in response to the output of the second multiplier.

5 Claims, 3 Drawing Sheets

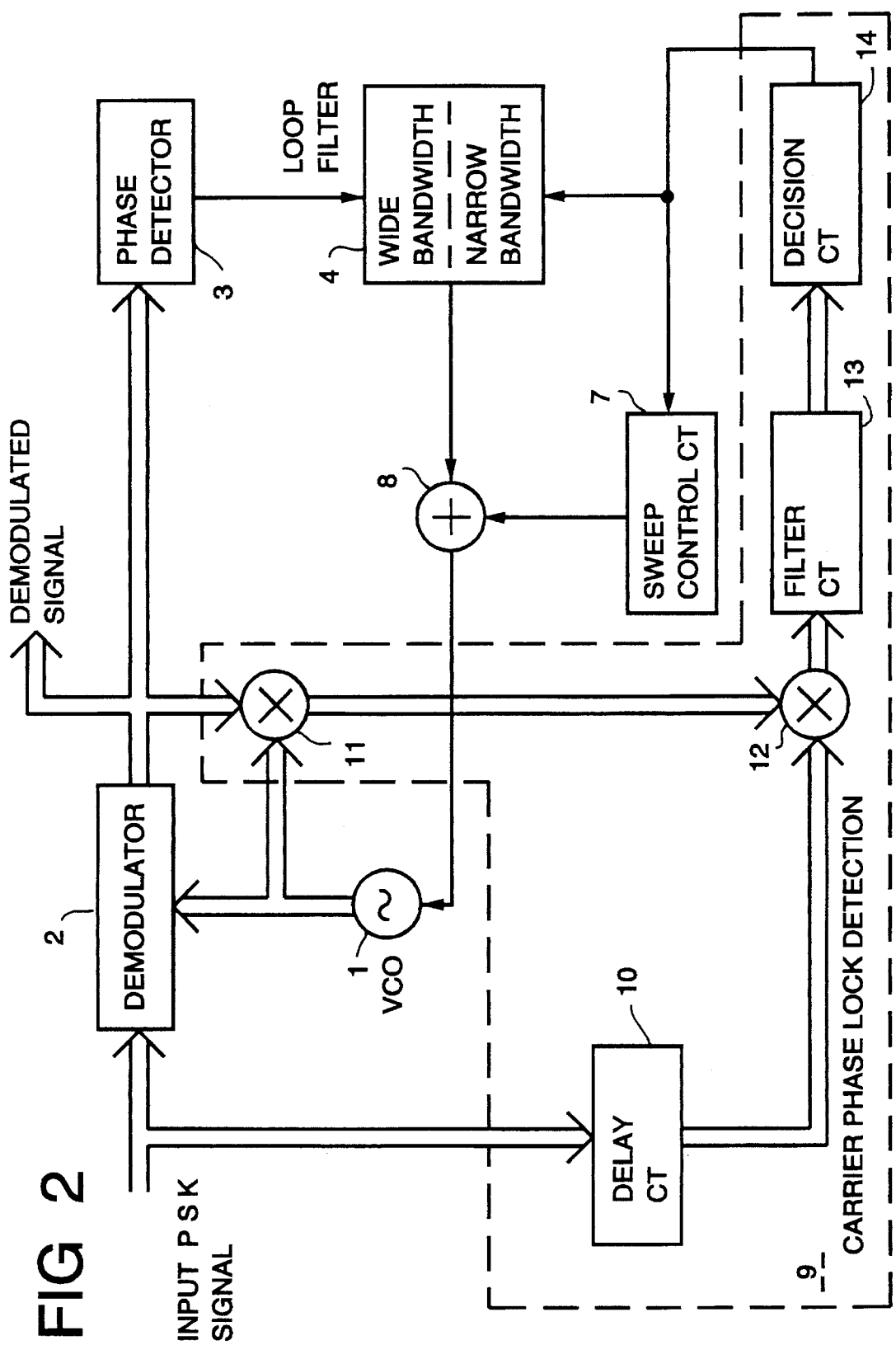

CARRIER PHASE LOCK DETECTING APPARATUS USED IN PSK-MODULATED SIGNAL RECEIVER FOR SATELLITE COMMUNICATION SYSTEM

BACKGROUND OF THE INVENTION

The present invention relates to a carrier phase lock detecting apparatus in a PSK-modulated signal receiver for a satellite communication system.

In a satellite communication system, a carrier frequency used thereof inherently becomes to have offset due to a doppler shift, a drift of the local oscillator and/or residues in the automatic frequency control (AFC) on an earth side or on a satellite side. Especially, since a satellite earth station is usually intended to be reduced in size and price, a less stable oscillator is applied, thus, inviting greater offset in the carrier frequency. Accordingly, in a receiver, various measures have been taken to achieve quick carrier frequency-and-phase acquisition to cope with such frequency offset. For instance, a phase-locked loop (PLL) circuit, which is extensively used for carrier recovery in the receiver, is so configured that a voltage-controlled oscillator (VCO) in the PLL circuit, which outputs a reference carrier signal, is swept by frequency control until an incoming carrier is caught. Thus, even in the presence of a carrier frequency offset, carrier acquisition becomes possible. Further, to make a phase-locked time short and to cope with the carrier frequency offset, the PLL circuit is designed to have a widened loop bandwidth for the carrier acquisition period and, after the carrier acquisition, the loop bandwidth is switched to have a narrower bandwidth so as to facilitate keeping the carrier acquisition against a noise.

In a mobile satellite communication system, shadowing of receiving signals caused by buildings and other obstacles on a transmission path further invites erroneous operation in the VCO. Therefore, it is necessary to detect occurrence of the shadowing quickly as possible and thus to inhibit the control of the VCO on the basis of an erroneous phase difference detection signal during the shadowing period.

In order to switch the aforementioned loop-bandwidth in the PLL circuit and detect the shadowing in the mobile satellite communication, a carrier phase lock detecting function is provided to detect carrier phase lock condition. FIG. 1 show a conventional PSK-modulated signal receiver including a prior art carrier phase lock detecting apparatus.

In FIG. 1, a PLL circuit arrangement including a VCO 1, a demodulator 2, a phase detector 3 and a loop filter 4 demodulates an incoming PSK-modulated signal and delivers demodulated data. For carrier phase lock detection, a unique word (UW) detecting circuit 5 and a frame synchronization circuit 6 are used. Thus, the frame synchronization signal from the circuit 6 is applied as a carrier phase lock detection signal to a frequency sweep control circuit 7. When frame synchronization is established, the sweep control circuit 7 stops the sweep operation for the VCO 1. In this figure, an adder 8 adds the control signals from the loop filter 4 and the sweep control circuit 7. There also is a method utilizing forward error correction (FEC) technique for carrier phase lock detection.

According to prior art carrier phase lock detecting apparatus described above, there are the following a disadvantages. As to the prior art utilizing the UW detecting circuit, it takes a long time for carrier phase lock detection since a frame unit including a UW is generally arranged to have mass of a lot of bits. Further, in a mobile satellite communication system, data involving the UW are interleaved in long frame units for the purpose of diffusing burst errors, which are caused by the shadowing. In this case, frame synchronization is judged by detecting the interleaved UW in the frames. Therefore, the prior art carrier phase lock detecting apparatus utilizing the UW detecting circuit requires a longer time for carrier phase lock detection in the mobile satellite communication system. Incidentally, the interleaving frame length is determined by a shadowing time and a received power variation period. The other disadvantages are that the prior art utilizing the UW detecting circuit requires a complicated circuit configuration and that the UW detecting circuit and the frame synchronization circuit are additionally needed to a demodulating circuit configuration.

On the other hand, the prior art utilizing the FEC technique also has a disadvantage requiring a longer time for carrier phase lock detection because the FEC technique requires redundancy information for error correction.

Consequently, the prior art carrier phase lock detecting apparatus can not perform carrier phase lock detection in the desirably quick time.

SUMMARY OF THE INVENTION

It is therefore an object of the present invention to provide a carrier phase lock detecting apparatus capable of performing quicker carrier phase lock detection.

It is another object of the present invention to provide a carrier phase lock detecting apparatus which has a less-complicated configuration and which can be equipped with a demodulating circuit configuration.

According to the present invention, there is provided a carrier phase lock detecting apparatus comprising a voltage-controlled oscillator for generating a reference carrier signal in response to a control signal; a demodulator for demodulating a received PSK-modulated signal in response to the reference carrier signal to deliver a demodulated signal; a phase detector for detecting a phase difference between the received PSK-modulated signal and the reference carrier signal on the basis of the demodulated signal to deliver a phase difference signal; a loop filter for filtering the phase difference signal to deliver the control signal; delay means for delaying the received PSK-modulated signal to deliver a delayed PSK-modulated signal; a first multiplier for multiplying the demodulated signal by the reference carrier signal to inversely modulate the demodulated signal; a second multiplier for multiplying the output of the first multiplier by the delayed PSK-modulated signal; and decision means for determining carrier phase lock in response to the output of the second multiplier.

BRIEF DESCRIPTION OF THE DRAWINGS

FIG. 2 is a block diagram showing an embodiment of the present invention;

DESCRIPTION OF THE PREFERRED EMBODIMENTS OF THE INVENTION

Figure 1:
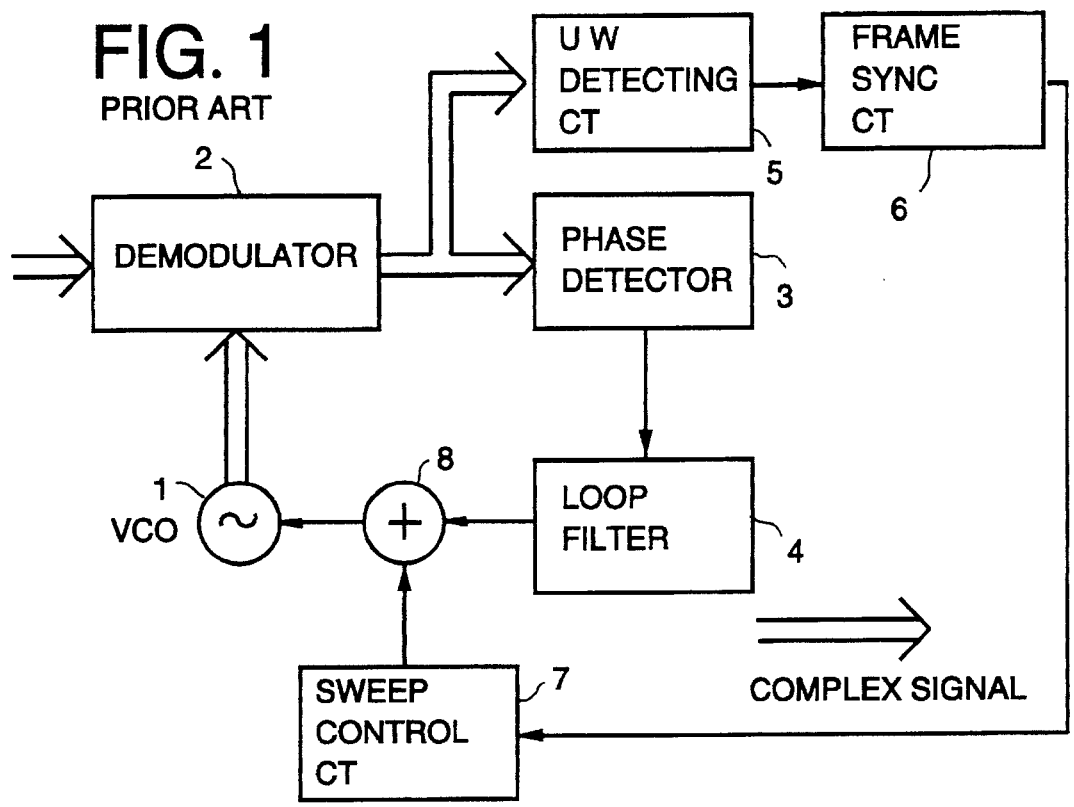
FIG. 1 is a block diagram showing a conventional demodulating arrangement including a prior art carrier phase lock detecting apparatus.

Referring to FIG. 2, an additional circuit configuration 9 is equipped with the conventional PLL circuit arrangement shown in FIG. 1. In FIG. 2, the PLL circuit arrangement for carrier lock comprises a a voltage-controlled oscillator (VC0) 1 for outputting a reference carrier signal, a demodulator 2 for demodulating a digitally modulated two-phase PSK signal, a phase detector 3 for delivering the phase difference between the input signal and the output of the VCO 1 on the basis of the demodulated signal, and a loop filter 4 for filtering the output of the phase detector 3. The additional circuit configuration 9 for carrier phase lock detection comprises a delay circuit 10 for delaying the input signal, a multiplier 11 for multiplying the demodulated signal from the demodulator 2 by the reference carrier signal, a multiplier 12 for multiplying the output of the multiplier 11 by the signal delayed by the delay circuit 10, a filter circuit 13 for filtering the output of the multiplier 12, and a decision circuit 14 for giving a decision on whether the carrier phase has been locked or not by comparing the output of the filter circuit 13 with a preset threshold.

Figure 3:
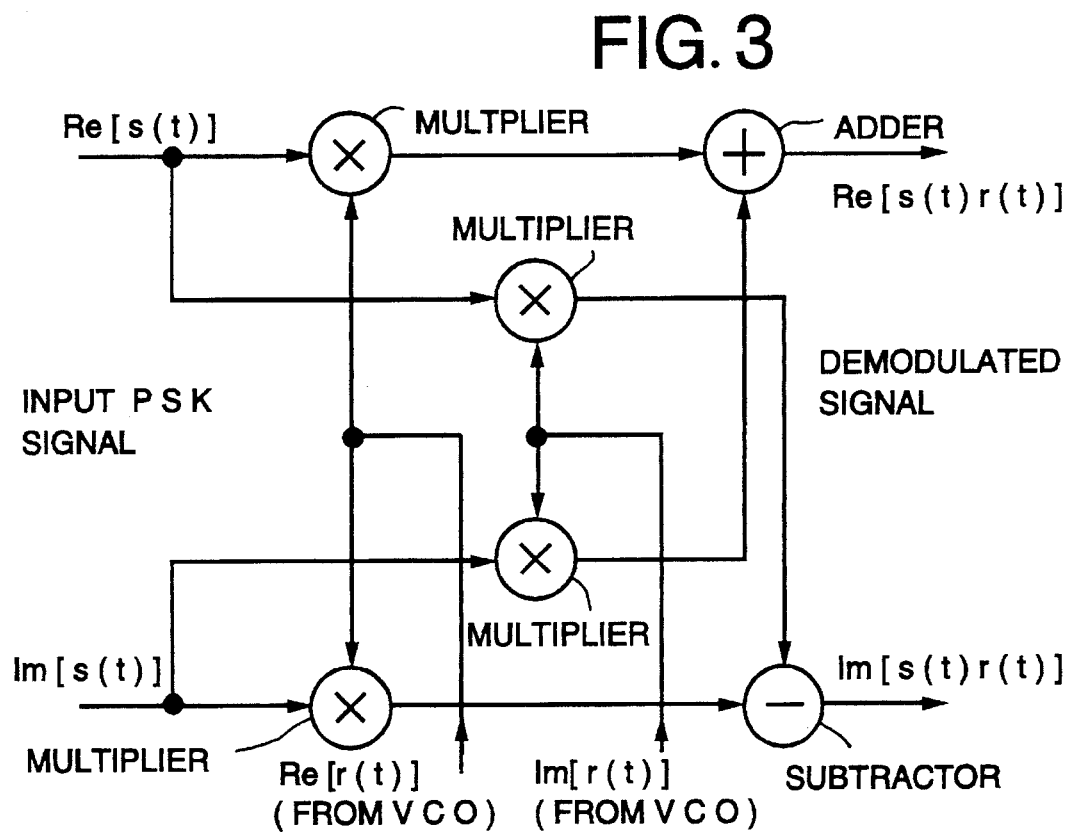
FIG. 3 shows a circuit arrangement of a demodulator showing in FIG. 2.

Next will be described the operation of this embodiment. The two-phase PSK signal is inputted to the demodulator 2 after being limited in a frequency band and, as shown in FIG. 3, subjected to orthogonal detection with a reference carrier outputted from the VCO 1. The orthogonal demodulated signal obtained by this orthogonal detection is outputted to the phase detector 3. The phase detector 3 outputs an input signal and an error signal corresponding to the phase difference between the phase of the reference carrier outputted from the VCO 1 and the phase of the input signal. The error signal is suppressed of its high frequency component by the loop filter 4 and fed to the VCO 1. This phase lock loop controls the phase of the reference carrier signal from the VCO 1 in the direction of compressing the phase error relative to the input signal, and enables the two-phase PSK signal to be correctly demodulated.

This demodulating process will be explained with reference to equations. Now, s(t) which is the PSK signal at time t is represented by Equation (1).

$$s(t)=A(t)e^{j(\omega c t+\theta i(t))} \quad (1)$$

Where, A(t) is a transmit data code ±d, ωc, the carrier frequency of the input signal and θi(t), the phase of the input carrier signal. The reference carrier signal r(t) of the VCO 1 is represented by Equation (2).

$$r(t)=e^{-j(\omega c t+\theta o(t))} \quad (2)$$

Where, θo(t) is the phase of the reference carrier. The demodulator 2 detects the input signal S(t) and the reference carrier signal r(t) by complex multiplication to give a result represented by Equation (3).

$$s(t) \cdot r(t)=A(t)e^{j(\theta i(t)-\theta o(t))}=A(t)e^{j\theta e(t)}=A(t)\{\cos \theta e(t)+j \sin \theta e(t)\} \quad (3)$$

Figure 4:
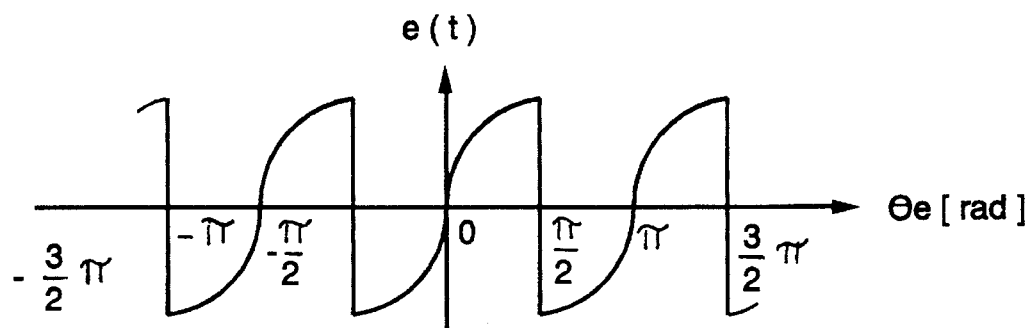
FIG. 4 is a diagram showing a characteristic of a phase detector shown in FIG. 2.

Where, θe(t) is θi(t)−θo(t), representing the phase difference between the input signal and the reference signal. In the case of the two-phase PSK signal, because of the in-phase and quadr-phase demodulated signal in which the real part A(t)cosθ(t) and the imaginary A(t)sinθe(t) part are orthogonal to each other, the detection characteristic of the phase detector is what is illustrated in FIG. 4, providing the error signal e(t) represented by Equation (4)

$$e(t)=A(t) \sin \theta e(t) \cdot SGN[A(t) \cos \theta e(t)] \quad (4)$$

Where, SGN [ ] denotes the signum function (hard limiter). This error signal is filtered and fed to the VCO 1. This error signal is filtered by the loop filter 4 and fed to the VCO1. By changing parameters in the loop filter 4, the loop band of the PLL is widened until the carrier phase is acquired so as to increase the acquisition range and reduce the acquisition time. When acquisition is completed, the decision circuit 14 detects, whether the carrier phase is in lock. Following the circuit's confirmation of phase lock, parameters in the loop filter 4 are changed, and the loop band of the PLL is decreased in order to keep carrier phase stability, even under low C/N (carrier power to noise power ratio) operational conditions. In this manner, the phase lock loop acts so as to reduce the phase difference between the input signal and the reference signal from the VCO 1 to zero.

Further, the output signal of the multiplier 11, when the demodulated signal from the demodulator 2 is inversely modulated by the multiplier 11 using the reference carrier outputted by the VCO 1, is represented by Equation (5).

$$\{s(t) \cdot r(t)\} \cdot r(t)=A(t)e^{j(\theta e(t)-\omega c t-\theta o(t))} \quad (5)$$

Where the delay circuit 10 is a circuit to delay the input signal by the time it required for demodulation and inverse modulation. Next, the multiplier 12 multiplies the input signal, whose delay has been adjusted, by the output of the multiplier 11 to output a signal y(t) represented by Equation (6).

$$y(t)=A^2(t)e^{j2\theta e(t)}=A^2(t) \cos (2\theta e(t))+jA^2(t) \sin (2\theta e(t)) \quad (6)$$

When the carrier phase is synchronized in the PLL and the phase error θ between the input signal and the reference carrier outputted by the VCO 1 becomes smaller, cos 2θ and sin 2θ in the real and imaginary parts of the signal outputted by the multiplier 12 become 1 and 0, respectively. Thus, as the carrier phase is locked, signals of which Re y(t) is represented by $d^2$ and Im y(t), by 0, are obtained from the real and imaginary parts of the output signal of the multiplier 12.

Figure 5:
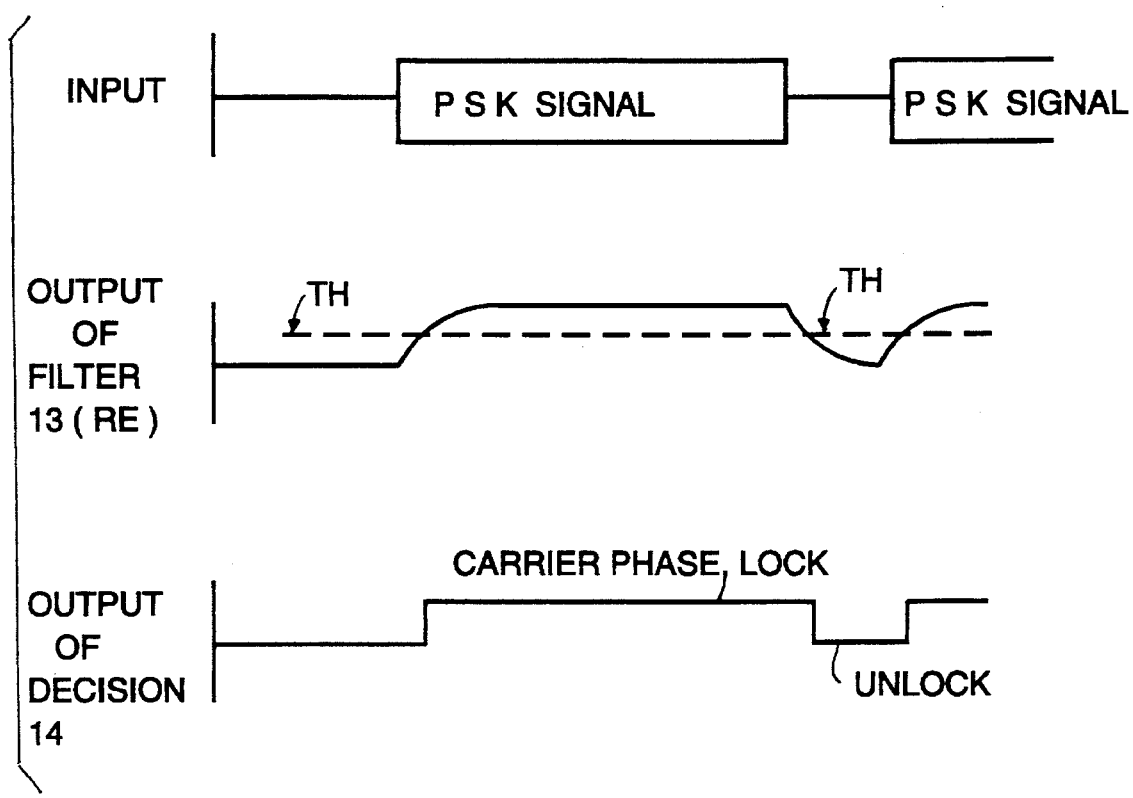
FIG. 5 is a diagram explaining operation of the embodiment shown in FIG. 2.

By respectively averaging these signals and respectively comparing them with a proper threshold, the lock of the carrier phase can be detected. In detail, the output signals of the multiplier 12 are averaged by the low-pass filter circuit 13 so as to minimize erroneous detections and failures to detect even if the signal is low in signal-to-noise ratio. The decision circuit 14 gives a decision as to whether the carrier phase is locked or not by comparison with the preset threshold. Thus, as illustrated in the explanatory diagram of FIG. 5, if carrier phase lock is detected at the point of time where the output signal level of the multiplier 12 surpasses the threshold, a state of phase lock will be affirmed. Otherwise, it will be decided that no carrier phase lock is established. In FIG. 5, though only the signal Re is explained, the signal Im can be also applied to decisions on the basis of its value "zero" when the carrier phase is locked. It is easy to arrange a logic circuit receiving the two signals Re and Im to make the decision output. Though the decision circuit 14 also detects the carrier phase lock at ±π in FIG. 4, this detection does not mean right demodulating operation. In this case, the VCO 1 is further swept for accurate demodulating operation by another control signal based on UW detection, for example. The present invention focuses the carrier phase lock detection.

In the embodiment of FIG. 2, on the basis of the quick carrier phase lock detection signal, 1̂ quick frequency sweeping control can be performed at the timing of catching an input carrier; 2̂ quick bandwidth switching of a loop filter can be performed for establishing carrier acquisition or for maintaining carrier acquisition; and ③ quick holding of carrier and clock phase information and quick inhibit of frequency control (AFC) can be effected in shadowing condition.

As hitherto stated, the carrier phase lock detecting apparatus according to the present invention is capable of detecting carrier phase lock in a short period of time with a simpler configuration than the prior art utilizing the UW control circuit and the frame synchronism circuit.

What is claimed is:

1. A carrier phase lock detecting apparatus comprising:
    (a) demodulation means for demodulating a received PSK-signal by a PLL circuit arrangement including:
        a voltage-controlled oscillator for generating a reference carrier signal in response to a control signal;
        a demodulator for demodulating said received PSK-modulated signal in response to said reference carrier signal to deliver a demodulated signal;
        a phase detector for detecting a phase difference between said received PSK-modulated signal and said reference carrier signal to deliver a phase difference signal; and
        a loop filter for filtering said phase difference signal to deliver said control signal;
    (b) remodulation means for remodulating said demodulated signal by multiplying said demodulated signal by said reference carrier signal;
    (c) delay means for delaying said received PSK-modulated signal by a time required for said demodulation means to demodulate said received PSK-modulated signal and said remodulation means to remodulate said demodulated signal;
    (d) multiplier means for multiplying the output of said remodulation means by the output of said delay means; and
    (e) decision means for determining carrier phase lock by comparing an averaged output of said multiplier means with a preset threshold level.

2. A PSK-modulated signal receiver comprising:
    (a) demodulation means for demodulating a received PSK-signal by a PLL circuit arrangement including:
        a voltage-controlled oscillator for generating a reference carrier signal in response to a control signal;
        a demodulator for demodulating said received PSK-modulated signal in response to said reference carrier signal to deliver a demodulated signal;
        a phase detector for detecting a phrase difference between said received PSK-modulated signal and said reference carrier signal to deliver a phase difference signal; and
        a loop filter for filtering said phase difference signal to deliver said control signal, said loop filter having wide and narrow bandwidth characteristics;
    (b) remodulation means for remodulating said demodulated signal by multiplying said demodulated signal by said reference carrier signal;
    (c) delay means for delaying said received PSK-modulated signal by a time required for said demodulation means to demodulate said received PSK-modulated signal and said remodulation means to remodulate said demodulated signal;
    (d) multiplier means for multiplying the output of said remodulation means by the output of said delay means; and
        a first multiplier for multiplying said demodulated signal by a time required for said demodulation means to demodulate said received PSK-modulation signal and said remodulation means to remodulate said demodulated signal; and
    (e) decision means for determining carrier phase lock by comparing an averaged output of said multiplier means with a preset threshold level, wherein said wide bandwidth characteristic is switched to said narrow bandwidth characteristic in response to the carrier phase lock determined by said decision means.

3. A PSK-modulated signal receiver comprising:
    (a) demodulation means for demodulating a received PSK-signal by a PLL circuit arrangement including:
        a voltage-controlled oscillator for generating a reference carrier signal in response to a control signal;
        a demodulator for demodulating said received PSK-modulated signal in response to said reference carrier signal to deliver a demodulated signal;
        a phase detector for detecting a phase difference between said received PSK-modulated signal and said reference carrier signal to deliver a phase difference signal; and
        a loop filter for filtering said phase difference signal to deliver said control signal;
    (c) delay means for delaying said received PSK-modulated signal by a time required for said demodulation means to demodulate said received PSK-modulated signal and said remodulation means to remodulate said demodulated signal;
    (e) decision means for determining carrier phase lock by comparing an averaged output of said multiplier means with a preset threshold level to deliver a carrier phase lock detection signal; and
    (f) a sweep control means for controlling an oscillation frequency of said voltage controlled oscillator in sweep manner, wherein said sweep control means stops sweep control in response to said carrier phase lock detection signal.

4. A PSK-modulated signal receiver as claimed in claim 3, wherein said loop filter has wide and narrow bandwidth characteristics and said wide bandwidth characteristic is switched to said narrow bandwidth characteristic in response to said carrier phase lock detection signal.

5. A carrier phase lock detecting apparatus as claimed in claim 1, wherein said decision means determines in response to a DC level contained in the output of said second multiplier.

* * * * *